(12) United States Patent
McTeer et al.

(10) Patent No.: US 6,455,424 B1
(45) Date of Patent: Sep. 24, 2002

(54) SELECTIVE CAP LAYERS OVER RECESSED POLYSILICON PLUGS

(75) Inventors: Allen McTeer, Meridian; Steven T. Harshfield, Emmett, both of ID (US)

(73) Assignee: Micron Technology, Inc., Boise, ID (US)

( * ) Notice: Subject to any disclaimer, the term of this patent is extended or adjusted under 35 U.S.C. 154(b) by 50 days.

(21) Appl. No.: 09/632,830

(22) Filed: Aug. 7, 2000

(51) Int. Cl.⁷ .............................................. H01L 21/44
(52) U.S. Cl. ...................... 438/675; 438/240; 438/608; 438/629; 438/63 T; 438/652; 438/672; 438/678; 438/686; 438/902
(58) Field of Search ............................ 438/3, 238–240, 438/253, 586, 608, 629, 637, 652, 657, 658, 672, 675, 678, 686, 902

(56) References Cited

U.S. PATENT DOCUMENTS

| | | | |
|---|---|---|---|
| 5,099,305 A | | 3/1992 | Takenaka |
| 5,111,355 A | | 5/1992 | Anand et al. |
| 5,187,638 A | | 2/1993 | Sandhu et al. |
| 5,227,855 A | | 7/1993 | Momose |
| 5,293,510 A | | 3/1994 | Takenada |
| 5,369,296 A | | 11/1994 | Kato |
| 5,381,302 A | * | 1/1995 | Sandhu et al. ............... 257/306 |
| 5,424,238 A | | 6/1995 | Sameshima |
| 5,443,688 A | | 8/1995 | Toure et al. |
| 5,452,178 A | | 9/1995 | Emesh et al. |
| 5,561,307 A | | 10/1996 | Mihara et al. |
| 5,612,082 A | | 3/1997 | Azuma et al. |
| 5,645,887 A | * | 7/1997 | Byun .......................... 438/655 |
| 5,654,207 A | | 8/1997 | Fukuyama et al. |
| 5,665,628 A | * | 9/1997 | Summerfelt .................... 438/3 |
| 5,674,787 A | * | 10/1997 | Zhao et al. .................. 438/627 |
| 5,688,724 A | | 11/1997 | Yoon et al. |
| 6,147,408 A | * | 11/2000 | Ogure et al. ................. 257/762 |
| 6,214,728 B1 | * | 4/2001 | Chan et al. .................. 438/678 |
| 6,291,250 B1 | * | 9/2001 | Igarashi ........................ 438/3 |

OTHER PUBLICATIONS

Jean W. Chevalier, Technic, Inc., *Electroless Gold Plating*, pp. 323–325 (source unknown).
R.F. Vines, R.H. Atkinson, and F.H. Reid, *Platinum Metals*, Ch. 13, pp. 342–357 (source unknown).

* cited by examiner

Primary Examiner—Caridad Everhart
Assistant Examiner—Craig P. Lytle
(74) Attorney, Agent, or Firm—Knobbe, Martens, Olson & Bear, LLP

(57) ABSTRACT

Methods are provided for selective formation of oxidation-resistant caps for conductive plugs in semiconductor device fabrication. One embodiment of the present invention forms a sacrificial layer over a recessed polysilicon plug. The sacrificial layer is readily planarized using chemical mechanical planarization to isolate the cap within a recessed via. Then, an immersion plating process is used to replace the atoms of the sacrificial layer with atoms of a desired metal, such as platinum, thereby creating a metal cap isolated within the via. The advantages of planarization to isolate material within recessed via are thus obtained without having to planarize or otherwise etch the desired metal. The cap layer can be further reacted to form a barrier compound prior to forming a capacitor over the plug. Advantageously, the plug structure resists oxidation during fabrication of overlying capacitors that incorporate high dielectric constant materials.

40 Claims, 9 Drawing Sheets

SELECTIVE CAP LAYERS OVER RECESSED POLYSILICON PLUGS

FIELD OF THE INVENTION

This invention relates generally to integrated conductive plugs contacting semiconductor elements and, more particularly, to oxidation-resistant partial plugs (e.g., oxygen barriers and conductive oxides).

BACKGROUND OF THE INVENTION

Semiconductor devices formed in the surface region of a silicon wafer substrate each have multiple elements to be electrically connected to the surrounding circuitry and to each other. Some of these electrical connections extend through protective insulating layers that cover each device level to electrically isolate adjacent levels. The insulating layers typically provide planarized surfaces for subsequent semiconductor device fabrication. Insulating materials include borophosphosilicate glass (BPSG), oxide deposited from tetraethyl-orthosilicate (TEOS), newer low dielectric (low k) materials, etc.

For example, a memory cell in an integrated circuit, such as a dynamic random access memory (DRAM) array, typically comprises a charge storage capacitor (or cell capacitor) electrically connected to an access device such as a Metal-Oxide-Semiconductor Field Effect Transistor (MOSFET). The MOSFET applies or removes charge on the capacitor, thus affecting the logical state defined by the memory cell. After formation of the MOSFET device elements, a protective insulating layer of BPSG is typically deposited, through which electrical connection must then be made to the subsequently fabricated capacitors and wiring layers above the BPSG layer. It is important to maintain good ohmic electrical connections between the capacitors and the underlying device elements (e.g., drain region of a MOSFET), and to maintain these good ohmic contacts throughout the lifetimes of the integrated circuits. Moreover, the material that contacts the substrate must be compatible so as not to poison the active areas and disturb finely tailored electrical characteristics.

Typically, vertical connections are made by filling vias formed through insulating layers with conductive polycrystalline silicon (i.e., polysilicon or poly), thereby contacting the substrate. The resultant structure filling the via is often referred to as a "poly plug."

In order to maintain a certain minimum charge storage as device dimensions are scaled down and packing densities increase, capacitors for DRAM devices are being developed for incorporation of dielectric materials having increased dielectric constants (k). Such high k materials include tantalum oxide ($Ta_2O_5$), barium strontium titanate (BST), strontium titanate (ST), barium titanate (BT), lead zirconium titanate (PZT) and strontium bismuth tantalate (SBT). These materials are characterized by effective dielectric constants significantly higher than conventional dielectrics (e.g., silicon oxides and nitrides). Whereas k equals about 3.9 for silicon dioxide, the dielectric constants of these new materials can range from 20 to 40 (tantalum oxide) to 300 (BST), and some even higher (600 to 800). Using such materials enables the creation of much smaller and simpler capacitor structures for a given stored charge requirement, enabling the packing density dictated by future circuit design.

Difficulties have been encountered, however, in incorporating these materials into fabrication process flows. For example, $Ta_2O_5$ is deposited by chemical vapor deposition (CVD) employing organometallic precursors in a highly oxidizing ambient. Additionally, after deposition the material is annealed to remove carbon. This anneal is typically conducted in the presence of nitrous oxide ($N_2O$), which is also highly oxidizing, while volatile carbon complexes are driven out.

Due to the oxidizing nature of the reactants and by-products for forming high-k materials, surrounding materials are subject to degradation. Similarly, formation of other high k materials often involves exposing adjacent materials to oxidizing or otherwise corrosive environments. Corrosion of the conductive materials forming the electrical connections to device elements reduces their conductivity, and has been viewed as a major obstacle to incorporating high-k materials into integrated circuits.

Accordingly, a need exists for improved contact plugs and methods of making the same.

SUMMARY OF THE INVENTION

The present invention is a method of selectively forming materials in conductive plugs in a manner that avoids etching the material. In the illustrated embodiments, a noble metal, preferably platinum, is incorporated into a cap to a conductive plug. In one embodiment, a sacrificial layer is deposited over a recessed silicon plug. The sacrificial layer is readily etched, particularly by chemical mechanical planarization, to isolate the material within a via. The layer is then replaced, preferably by immersion plating, with the noble metal. Alternatively, the refractory metal layer can be directly formed by selective deposition, particularly electroless plating, which does not require the formation of a sacrificial layer.

Thus, in accordance with one aspect of the invention, a method is provided for selectively forming a cap layer for a conductive plug. A via, exposing a semiconductor substrate, is formed in a semiconductor substrate. A partial plug then partially fills the via to directly contact the substrate. A sacrificial layer is deposited into the via, in electrical contact with the partial plug, and over the insulating layer. Excess sacrificial metal layer is removed from over the insulating layer. Atoms of the sacrificial metal layer within the via are replaced with atoms of a cap material.

In accordance with another aspect of the invention, a method is provided for fabricating an integrated circuit. The method includes filling a contact via in an integrated circuit with a silicon plug. The plug is recessed, and a plug cap including a noble metal is selectively formed over the recessed silicon plug without etching the noble metal. A capacitor is then formed over the plug cap, the incorporating high k dielectric material.

In accordance with another aspect of the invention, a process is provided for forming an integrated circuit memory cell. A recessed plug is formed within a via through an insulating layer. The recessed plug is thereby electrically connected to a transistor active area. A cap layer, comprising non-oxidizing material, such as an oxygen barrier or a conductive oxide, is selectively formed within the via over the recessed plug. A capacitor with a high dielectric constant material is then formed over the cap layer.

In accordance with another aspect of the invention, a method is provided for forming a plurality of non-oxidizing contact structures in an integrated circuit. The method includes forming a plurality of openings through an insulating layer, and then blanket depositing a sacrificial material over the insulating layer and into the openings. The sacrificial layer is etched to remove it from over the insulating layer outside the openings, and the sacrificial layer left inside the openings is replaced with a non-oxidizing material, such as an oxygen barrier or a conductive oxide.

In accordance with another aspect of the invention, a memory cell is provided in an integrated circuit. The cell includes a silicon partial plug that partially fills a via formed through an insulating layer. The partial plug contacts an underlying semiconductor substrate. A plug cap comprising a noble metal fills a top portion of the via over the partial plug. A capacitor with a high dielectric constant material is positioned over the plug cap.

In accordance with another aspect of the invention, an integrated circuit is provided with a conductive plug. The plug includes a partial plug that is compatible and in electrical contact with an underlying semiconductor substrate. A platinum-containing cap layer is aligned over the partial plug, making electrical contact with the partial plug. An insulating layer surrounds the partial plug and cap layer.

BRIEF DESCRIPTION OF THE DRAWINGS

These and other aspects of the invention will be apparent to the skilled artisan from the following detailed description read in conjunction with the appended drawings, which are meant to illustrate, and not to limit, the invention, and in which.

DETAILED DESCRIPTION OF THE PREFERRED EMBODIMENT

The preferred embodiments describe methods of forming conductive interconnections with selectively formed non-oxidizing, oxygen barrier or conductive oxide plug caps, which incorporate noble metal layers, beneath high k capacitors of an advanced DRAM circuit design. Persons skilled in the art will appreciate, in view of the disclosures herein, however, that the methods and structures disclosed herein will have application in a variety of contexts, particularly where conductive interconnections in integrated circuits are to make contact between elements of different chemical and electrical characteristics.

In one preferred embodiment of the present invention, the plug caps are formed by depositing a sacrificial layer over a recessed plug, planarizing to leave the sacrificial layer only in the via, and replacing the sacrificial layer with a second conductive material using an immersion plating process. In another embodiment of the present invention, the plug caps are formed by a selective electroless plating process.

Figure 1:
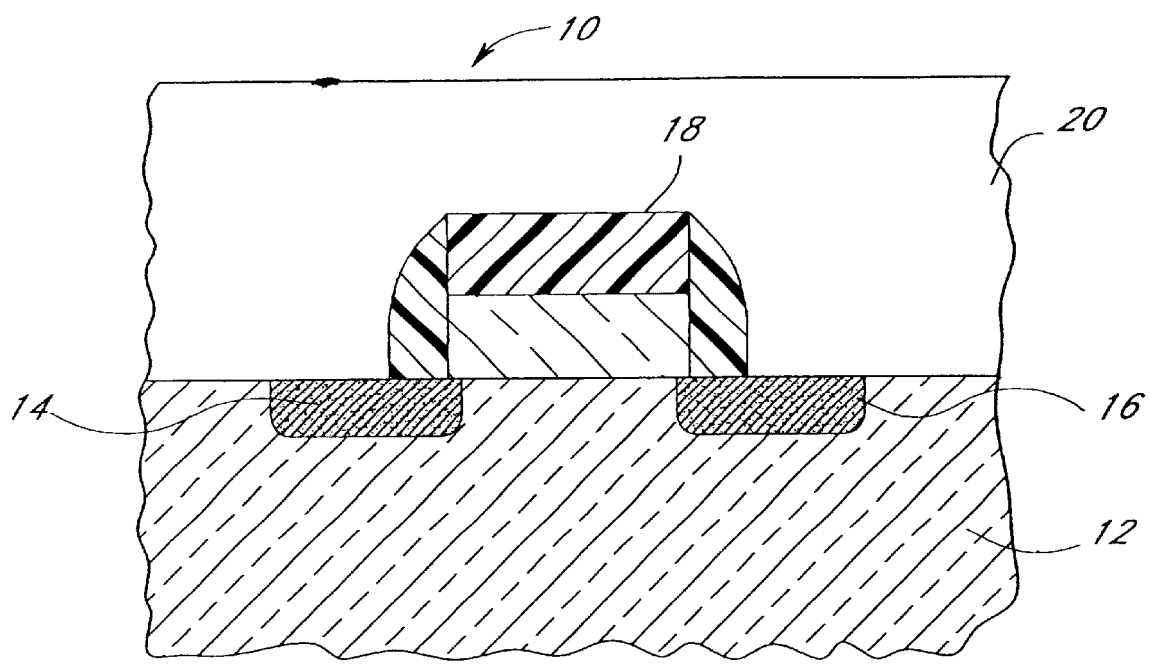
FIG. 1 schematically illustrates a typical MOSFET device structure in a partially fabricated integrated circuit, in accordance with a starting point for the preferred embodiment of the present invention.

FIG. 1 schematically illustrates a partially fabricated integrated circuit, comprising a MOSFET overlying a semiconductor substrate 12. While the illustrated semiconductor substrate 12 comprises an intrinsically doped monocrystalline silicon wafer, it will be understood by one of skill in the art of semiconductor fabrication that in other arrangements, the semiconductor substrate 12 can comprise other forms of semiconductor layers which include active or operable potions of semiconductor devices. Several device elements not relevant to the discussion here, such as field oxide elements to isolate the active areas of different transistors, are omitted for simplicity.

The transistor comprises source 14 and drain 16, active areas formed within the substrate 12 and a gate structure 18 overlying the substrate between the active areas 14, 16. The width of the gate structure 18 is preferably less than about 0.25 μm for current and future generation integrated circuits. Scaling down of the gate width leads to smaller footprints available for capacitor plates, deeper and narrower contacts, smaller metal line widths and spacing, etc.

A first insulating layer 20, typically comprising a form of oxide such as borophosphosilicate glass (BPSG), is deposited over a plurality of transistors 10 (one shown) across the substrate 12. In order to operate the MOSFET device structure 10, electrical connection is made through the first insulating layer 20 from the MOSFET to other electrical elements in the integrated circuit. For example, to fabricate a DRAM cell, the MOSFET's drain region 16 is electrically connected to a capacitor. Depending upon the presence or absence of other circuit elements, the first insulating layer 20 can have a thickness between about 0.5 μm to 2.0 μm. For example, certain DRAM circuit designs call for "buried" digit lines running below the cell capacitors, such that a thicker first insulating layer 20 is required to electrically isolate the digit line from the underlying transistors and the overlying capacitors.

Figure 2:
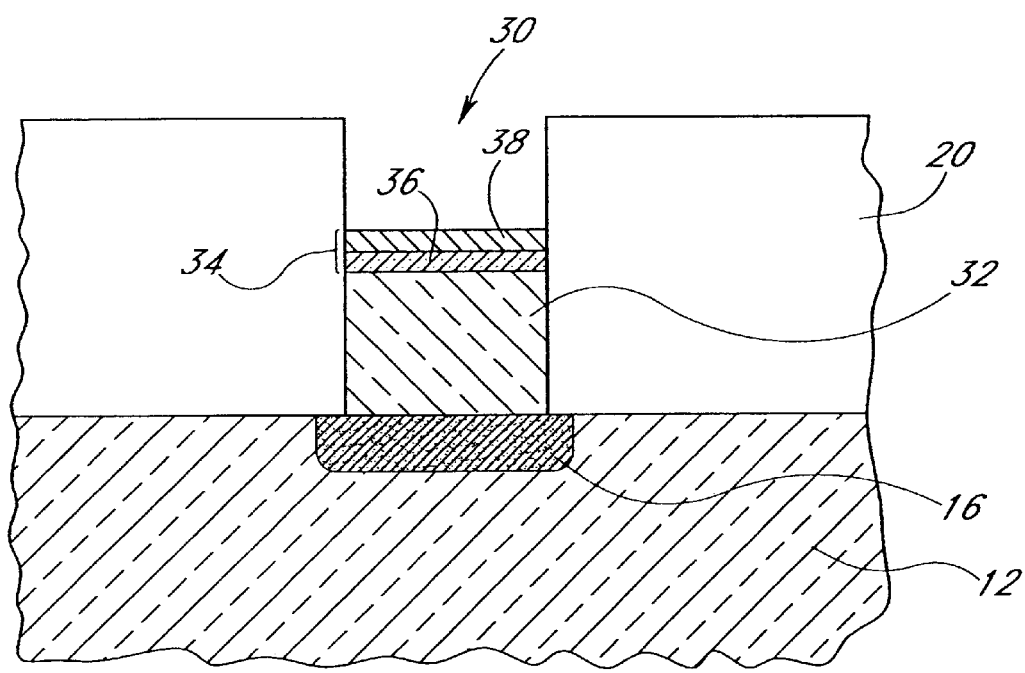
FIG. 2 schematically illustrates the integrated circuit of FIG. 1 following formation of an insulating layer, a via etched therethrough, and a polysilicon plug partially filling the via.

FIG. 2 schematically illustrates an interim step in the fabrication process of a DRAM cell, in accordance with the preferred embodiment. A substantially vertical via 30 is formed through the first insulating layer 20 to expose the drain region 16 below. One possible method of forming the via 30 is to perform a contact etch through the first insulating layer 20, ending at the drain region 16. The illustrated via 30 is substantially circular in cross-section, with a width or diameter preferably between about 0.10 μm and 0.5 μm, more preferably between about 0.15 μm and 0.25 μm. The via can, however, have other geometries and dimensions without departing from the spirit and scope of the present invention.

In the illustrated embodiment, where the via opens to the substrate, the via 30 is preferably partially filled by a partial plug 32, comprising an initial conductive material, to electrically contact the drain region 16. In the illustrated embodiment, the partial plug 32 comprises conductively doped polycrystalline silicon ("polysilicon" or "poly"), and can be formed by any suitable processes. Advantageously processes are well developed for depositing polysilicon into deep, narrow contact vias with good step coverage using chemical vapor deposition (CVD). Moreover, polysilicon has a relatively high melting point, enabling it to withstand further front-end high temperature processing. In other arrangements, the partial plug 32 can comprise tungsten or metal silicide. Like polysilicon, CVD processes for depositing tungsten, tungsten silicide ($WSi_x$) and titanium silicide ($TiSi_x$) are well developed.

In the illustrated embodiment, the partial plug 32 is formed first by a blanket deposition, followed by recessing with an etch back process (e.g., reactive ion etch or wet chemical etch) to yield a recessed or partial plug 32. The distance the partial plug 32 is recessed from the top surface of the first insulating layer 20 is preferably between about 500 Å and 10,000 Å, more preferably between about 1,000 Å and 5,000 Å, and in the illustrated embodiment is between about 1,500 Å and 2,000 Å. Note that the figures are not drawn to scale. Persons skilled in the art will recognize other methods of forming the via 30 and the partial plug 32 that are compatible with the preferred embodiment of the present invention. For example, the partial plug 32 can be formed by selectively depositing poly into the via 30.

The skilled artisan will readily appreciate that the methods of the preferred embodiments can also be applied to plug constructions within the partial plug. For example, where the contact is to be made to metal or other material less sensitive than the transistor active area, particularly where the via has a less severe aspect ratio than the preferred embodiments, the entire plug can be formed of platinum or other material in accordance with the preferred embodiments.

Returning to the preferred embodiments, FIG. 2 shows a transition region 34, providing ohmic contact between the partial plug 32 and the subsequent overlying layers. In FIG. 2, this transition region 34 comprises a titanium silicide ($TiSi_x$) layer 36 and a titanium nitride (TiN) layer 38. The latter layer serves as an effective diffusion barrier. One method of fabricating the transition region 34 is self-aligned silicidation, which comprises a blanket deposition of titanium (Ti), followed by an annealing step in a nitrogen atmosphere. This process forms the $TiSi_x$ layer 36 on top of the partial plug 32, with the TiN layer 38 on top of the $TiSi_x$ layer 36, leaving the structure shown in FIG. 2. Alternatively, any excess Ti can be selectively etched away after silicidation and a TiN layer can be deposited over silicide. Though not shown, it will be understood that forming the transition region may include deposition of material on the sidewalls of the recessed via 30, which sidewall material can remain through to formation of the final structure, depending upon the method of formation. Persons skilled in the art recognize that there are other methods of forming the transition region 34 that are compatible with the preferred embodiment of the present invention.

The recessed or partial plug 32 is then capped with a desired conductive material by selectively refilling the recessed portion of the via 30, i.e., without mask steps. The desired material of the preferred embodiments comprises a metal that is difficult to polish using conventional planarization techniques. Exemplary materials that are particularly suitable for capping a plug beneath a high k capacitor include palladium, platinum, iridium, rhodium, ruthenium, gold and alloys of these materials that form conductive barriers or conductive oxides that do not degrade in oxygen. (e.g. TiAlN, PtIr, PtRu, PtRh, $RuO_x$, $IrO_x$, etc.) In the illustrated embodiment, selective refilling is accomplished by a sacrificial deposition, polishing for isolation, and a substitution reaction.

Figure 3:
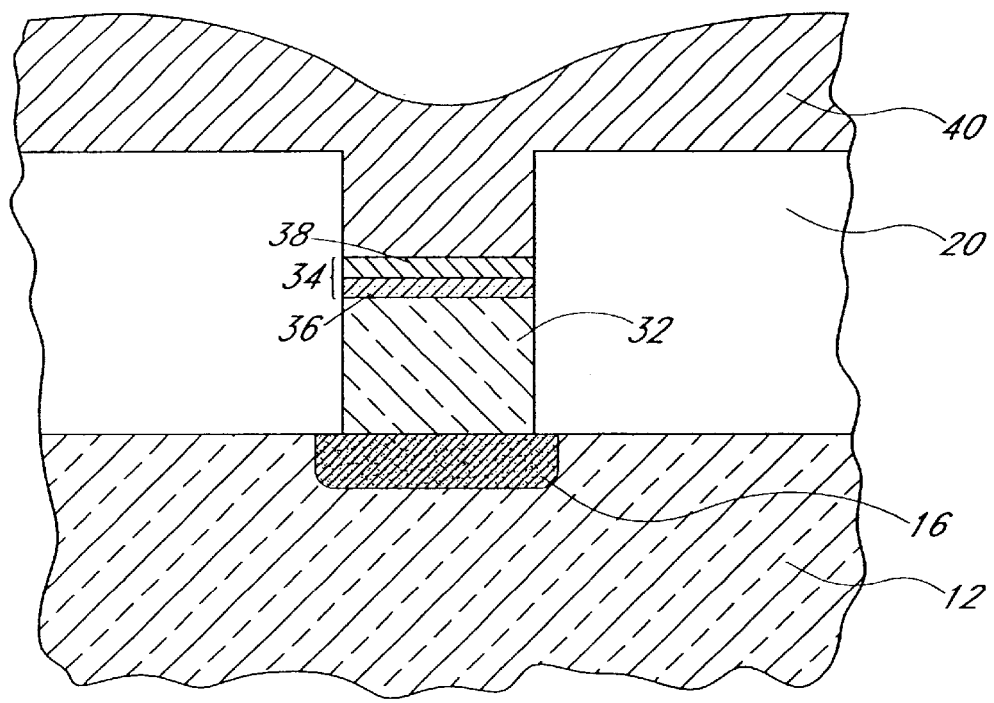
FIG. 3 schematically illustrates the integrated circuit of FIG. 2, following deposition of a sacrificial layer onto the first insulating layer and into the via.

FIG. 3 shows a first step in selectively refilling, in accordance with the illustrated embodiment of the present invention. A sacrificial layer 40 is blanket deposited onto the first insulating layer 20 and the via 30, resulting in the structure illustrated in FIG. 3. The sacrificial layer 40 comprises material that is susceptible to a planarization process (e.g., chemical mechanical planarization, dry etch). The material can be readily oxidized and can either be mechanically abraded, or can form a volatile species during an etch. Preferably, the sacrificial layer 40 material is a metal that is less noble than the desired final refractory metal layer. For example, for a desired cap layer comprising platinum, materials for the sacrificial layer 40 include, but are not limited to: copper, tungsten, silver and titanium. In the illustrated embodiment of the present invention, the sacrificial layer 40 comprises copper deposited by physical vapor deposition (PVD).

Figure 4:
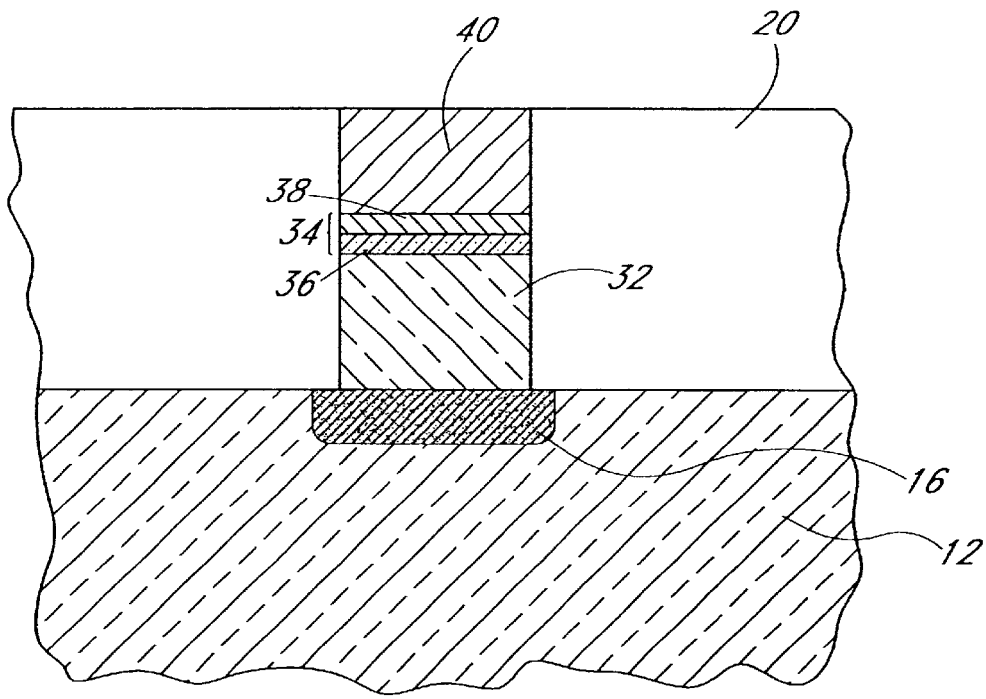
FIG. 4 schematically illustrates the integrated circuit of FIG. 3, where the sacrificial metal layer has been confined to the via.

By planarizing the sacrificial layer 40 to remove the excess sacrificial material, the sacrificial layer 40 is confined to the via 30, as illustrated in FIG. 4. Such planarization can be accomplished by mechanical abrasion, preferably chemically aided by etchants in a slurry in a chemical-mechanical planarization or polishing (CMP) process. Advantageously, CMP electrically isolates the sacrificial layer 40 in plugs across an array from one another in a self-aligned manner, without the expense of an additional photolithographic mask step. Persons skilled in the art can readily determine an effective slurry chemistry for aiding the removal of the preferred sacrificial material (copper) while stopping the etch when the first insulating layer 20 is exposed. As will be appreciated by the skilled artisan, a CMP shield or an etch stop layer can also be employed to help define the stopping point for the planarization.

After the CMP process, a replacement reaction is conducted in which the atoms of the sacrificial layer 40 are replaced by atoms of a different material, forming a plug cap 50. The illustrated replacement reaction comprises immersion plating, which utilizes a galvanic displacement reaction between the sacrificial metal and a relatively more noble metal ion in solution. Immersion plating baths typically comprise a salt with metal ions (e.g., ammonium hydroxide- or potassium-based metal salts) in a solvent with chelating agents, buffers and other stabilizers. By immersing the sacrificial layer 40 (e.g., copper) in a bath comprising ions of a more noble metal (e.g., platinum), the sacrificial atoms are replaced by atoms of the more noble metal. Possible choices for the substituted noble metal are gold, platinum, silver, iridium, ruthenium, rhodium, osmium, etc. The illustrated embodiment employs a high-metal-ion-concentration acid immersion plating bath held at approximately 65° C. and comprising approximately 20 g/L of platinum as $H_2PtCl_6$ and 300 g/L of hydrochloric acid. Alternatively, a commercially available immersion plating bath may be used. For example, Technic, Inc. of Providence, RI has a palladium immersion plating solution called "Pallamerse"

and a gold immersion plating solution called "Oromerse N" which are compatible with the present invention. Similarly, other sacrificial metals can be replaced with more noble (higher reduction potential) metals immersion plating. Persons skilled in the art can readily determine an effective bath chemistry for immersion plating the substitute metal layer in place of the sacrificial layer 40.

Figure 5:
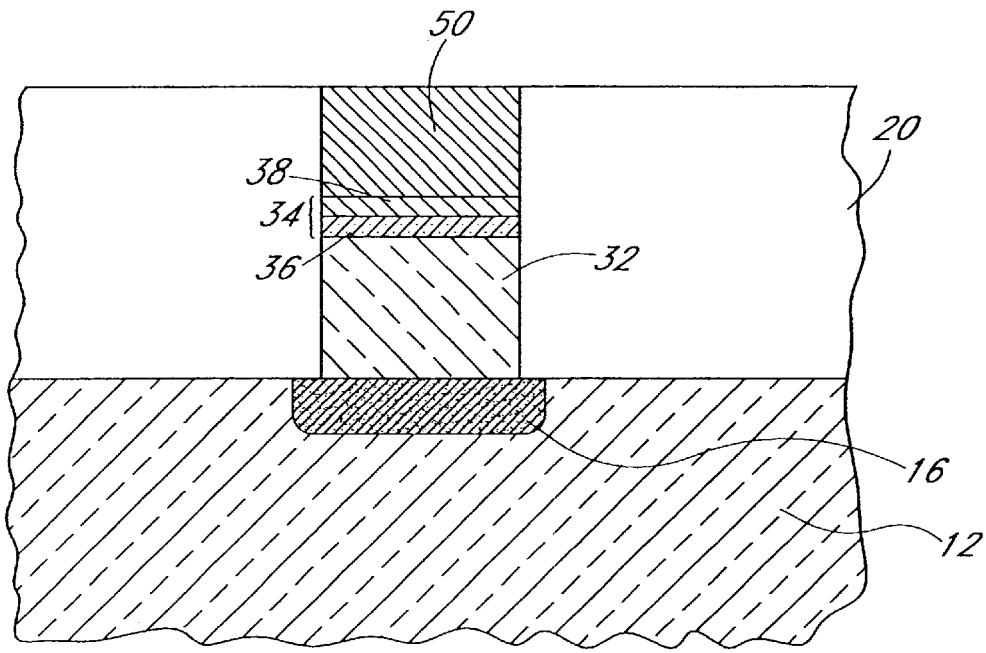
FIG. 5 schematically illustrates the integrated circuit of FIG. 4, where the sacrificial metal layer has been replaced by another metal layer, forming a plug cap.

The resulting structure, shown schematically in FIG. 5, has a plug cap 50 over the first conductive barrier region 34 and confined to the via 30. In the illustrated embodiment of the present invention, the plug cap 50 comprises platinum, which is conductive and resistant to oxidation.

Utilizing a sacrificial layer 40 and a substitution reaction permits the use of metals which are difficult to remove by CMP or dry etch, such as platinum, while still obtaining the processing advantages of using standard planarization techniques to isolate the plug cap, rather than photolithography. For example, using a standard CMP process to remove excess platinum is somewhat difficult because the relative softness of platinum causes the metal to smear across the CMP-stopping surface, and it does not readily oxydize, such that a mechanical process would be needed to planarize it. Conventional planarization is therefore not reliable for completely removing platinum and similar materials between plugs, risking short circuits between devices. Platinum and other metals that are difficult to planarize are particularly useful, however, for maintaining their conductivity, in the face of highly oxidizing environments, such as during formation of high-k dielectric layers. Moreover, platinum can be alloyed to form effective diffusion barrier against oxygen and other contaminants.

In other arrangements, the plug cap 50 can be selectively formed directly on the interlayer region 34. For example, electroless plating can be employed to selectively form the desired cap within the via 30 over the recessed plug 32. Electroless plating is similar to immersion plating in that it is also a controlled autocatalytic reduction of a dissolved metal. Unlike inversion plating, electroless plating utilizes a separate reducing agent to prepare the partial plug surface for plating of the cap material.

As noted, the preferred cap can comprise a conductive alloy or compound that serves as an effective barrier against diffusion of oxygen or other contaminants, such as TiAlN, PtIr, PtRu, PtRh, $RuO_x$, $IrO_x$, etc. Accordingly, the selectively formed cap layer 50 can be optionally converted (e.g., oxidized or alloyed) to an appropriate barrier material prior to completion of the integrated circuit.

Figure 6:
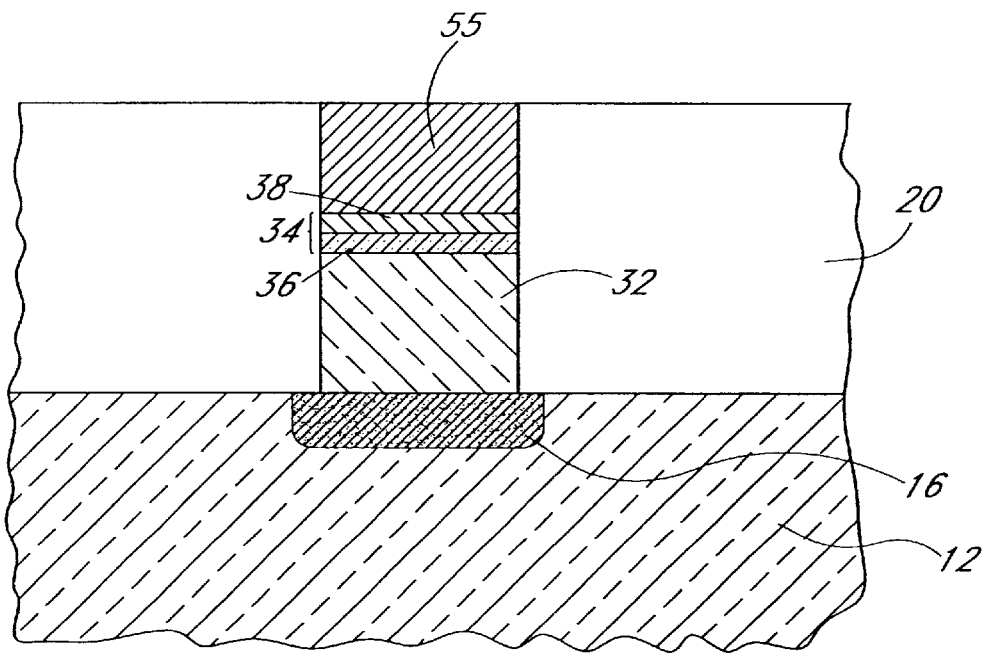
FIG. 6 schematically illustrates the integrated circuit of FIG. 5, where the plug cap has been alloyed to produce a barrier material.

In the preferred embodiment illustrated in FIG. 6, the initial, selectively formed plug cap 50 is converted to a barrier plug cap 55 comprising a platinum-rhodium alloy ($PtRh_x$). One method of forming the barrier plug cap 55 is to deposit rhodium over the initial plug cap 50, followed by annealing (e.g., heating to 400° C.–700° C. for 2–30 minutes). The anneal creates an platinum-rhodium alloy by interdiffusion at the platinum-rhodium interface. Depending upon the amount of rhodium and length/temperature of the anneal, the platinum can be wholly or partially alloyed. Persons skilled in the art will recognize that other suitable barrier materials can be used without departing from the spirit and scope of the present invention. For example, many metal nitrides are also known to serve effectively as conductive diffusion barriers.

While the subsequent figures illustrate a wholly converted barrier cap layer 55, it will be understood that, in other arrangements, the cap layer can include only a surface barrier layer. Alternatively, the initial cap layer 50 as formed by the selective process, can be employed without further modification.

Figure 7:
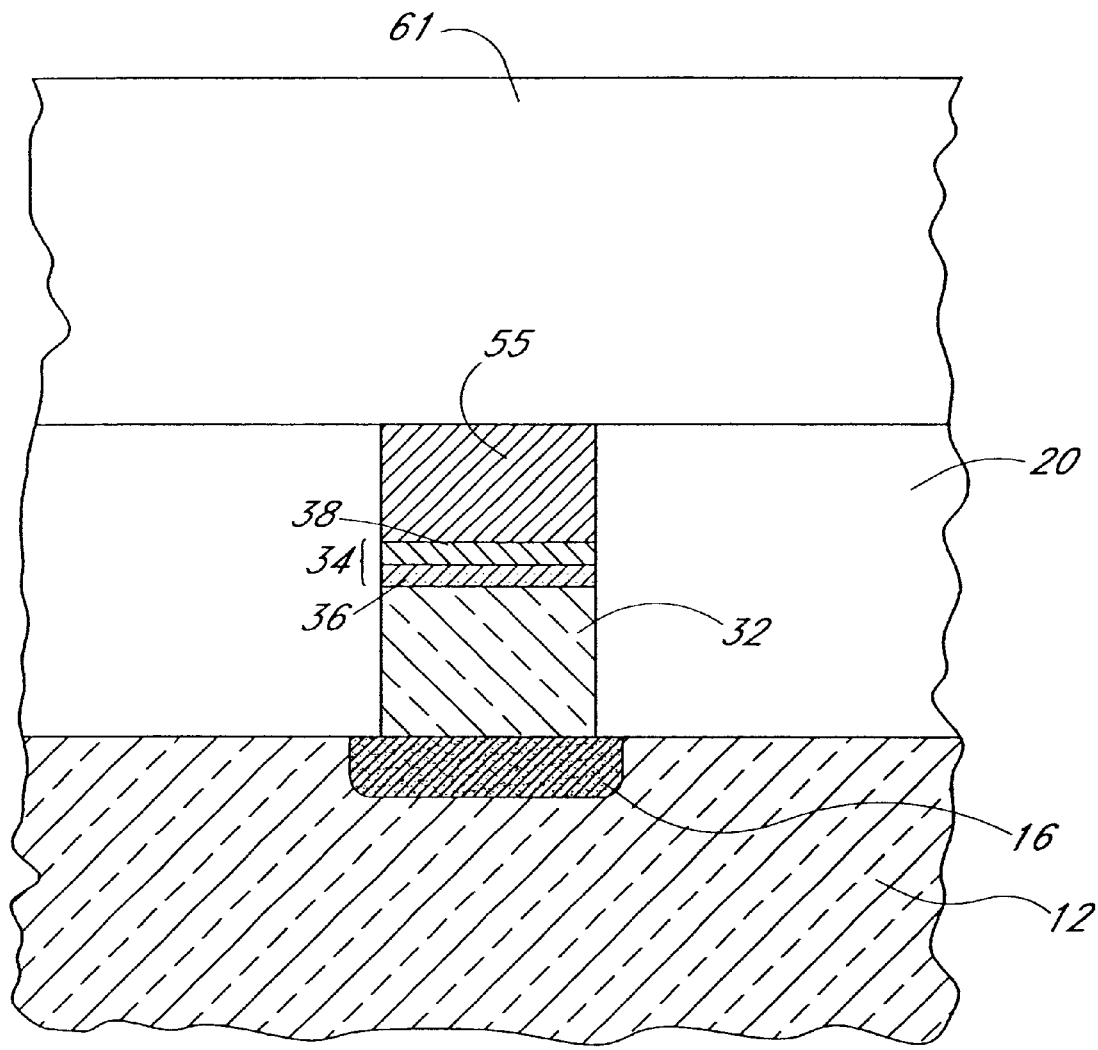
FIG. 7 schematically illustrates the integrated circuit of FIG. 6, where a second insulating layer has been formed over the first insulating layer and the plug cap.

After the plug cap 50 is formed, a capacitor 60 is fabricated thereupon. In the illustrated embodiment, a second insulating layer 61 is formed over the first insulating layer 20 and the plug cap 50, as schematically illustrated in FIG. 7. Desirably, the second insulating layer 61 is thick enough to electrically insulate overlying conductors from underlying devices. In the illustrated embodiment, the second insulating layer 61 also serves as a structural layer in which a three-dimensional, folding capacitor is to be defined. Preferably, the insulating layer 61 comprises an oxide formed from tetraethylorthosilicate (TEOS), which is slightly denser than BPSG. Alternatively, the second insulating layer 61 can comprise BPSG, low k material or other suitable insulating material. Preferably, the thickness of the second insulating layer 61 is greater than about 500 Å, more preferably greater than about 1,500 Å, and most preferably between about 2,000 Å and 3,000 Å.

Figure 8:
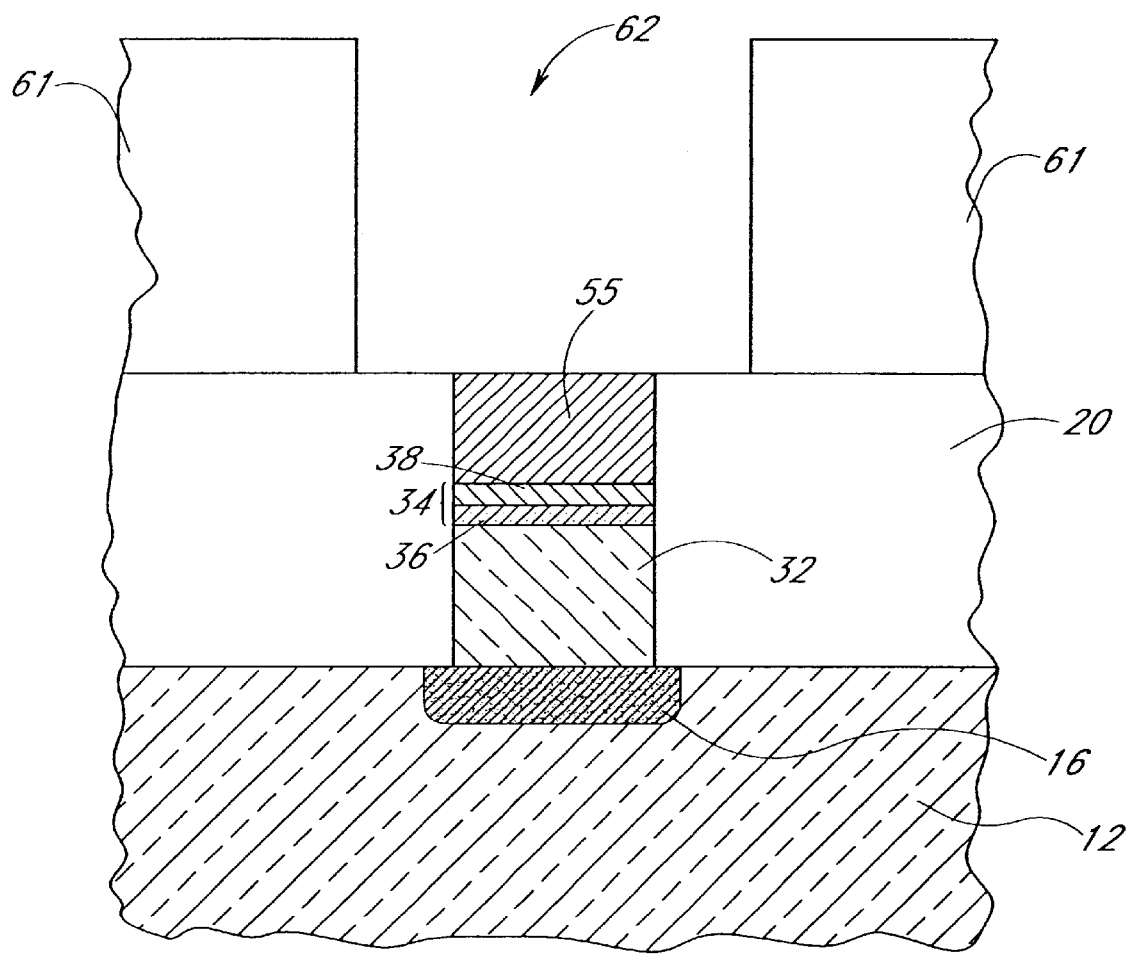
FIG. 8 schematically illustrates the integrated circuit of FIG. 7, where a substantially vertical container-shaped via has been formed in the second insulating layer, exposing the plug cap.

After the deposition of a second insulating layer 61, a "container" shaped via 62 is etched into the second insulating layer 61 to expose the plug cap 50, as illustrated in FIG. 8. The illustrated container via 62 is substantially cylindrical, with a preferred diameter between about 0.15 μm and 0.25 μm. Persons skilled in the art will readily recognize a variety of other capacitor configurations and corresponding methods of fabrication for maximizing capacitor surface area.

Figure 9:
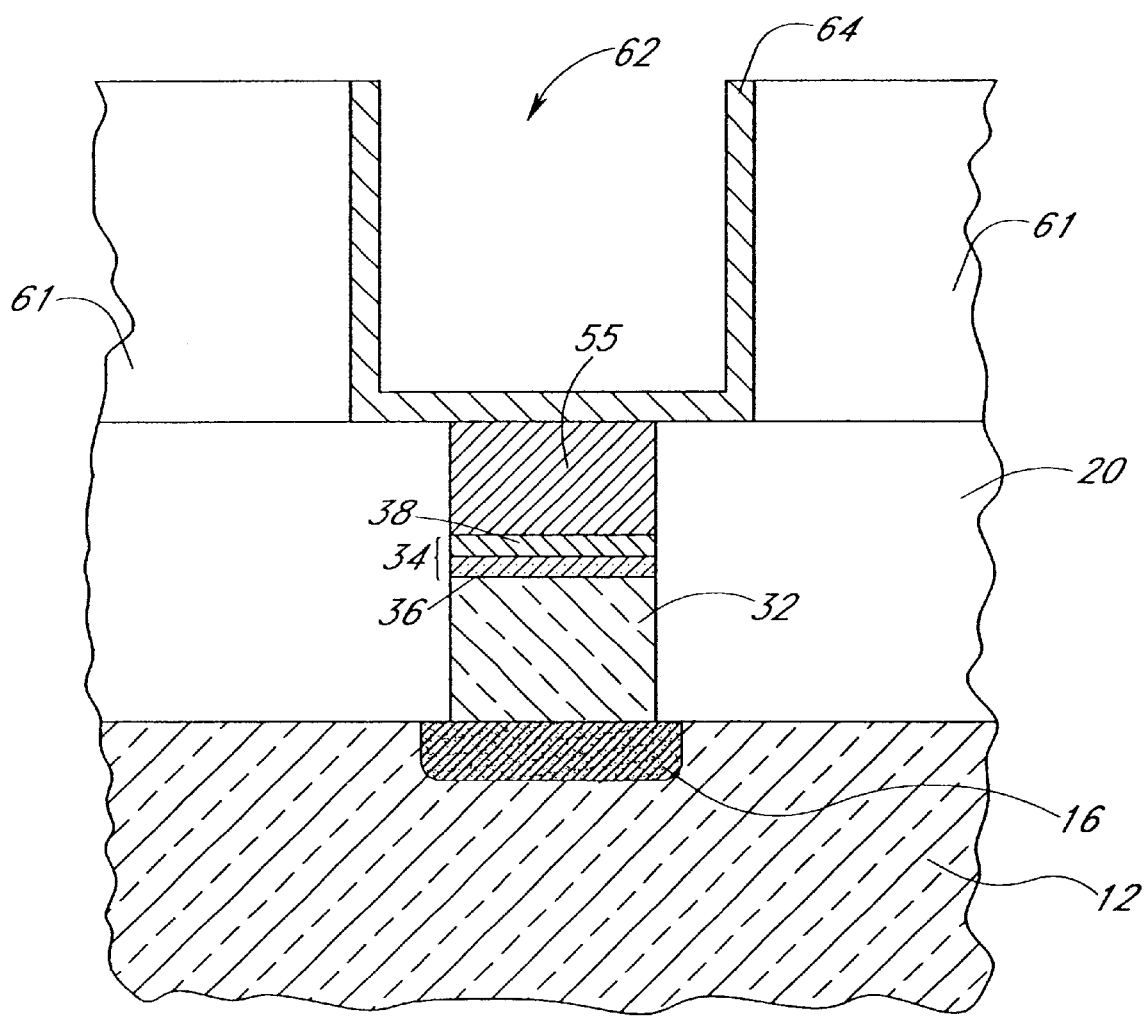
FIG. 9 schematically illustrates the integrated circuit of FIG. 8, where a bottom electrode layer has been deposited and isolated to line the via.

The container via 62 is then coated with a deposited conductive layer, which forms the bottom electrode 64 of the capacitor. In the embodiment illustrated in FIG. 9, the bottom electrode 64 comprises platinum. This bottom electrode 64 has a preferred thickness preferably between about 100 Å and 500 Å. Persons skilled in the art will recognize that a variety of materials and processes can be used to form the bottom electrode 64, including, but not limited to, chemical-vapor deposition (CVD), physical-vapor deposition (PVD) or plating (electroplating, electroless or displacement), followed by patterning (e.g., a dry-etch process to remove the excess metal outside the container via 62).

Figure 10:
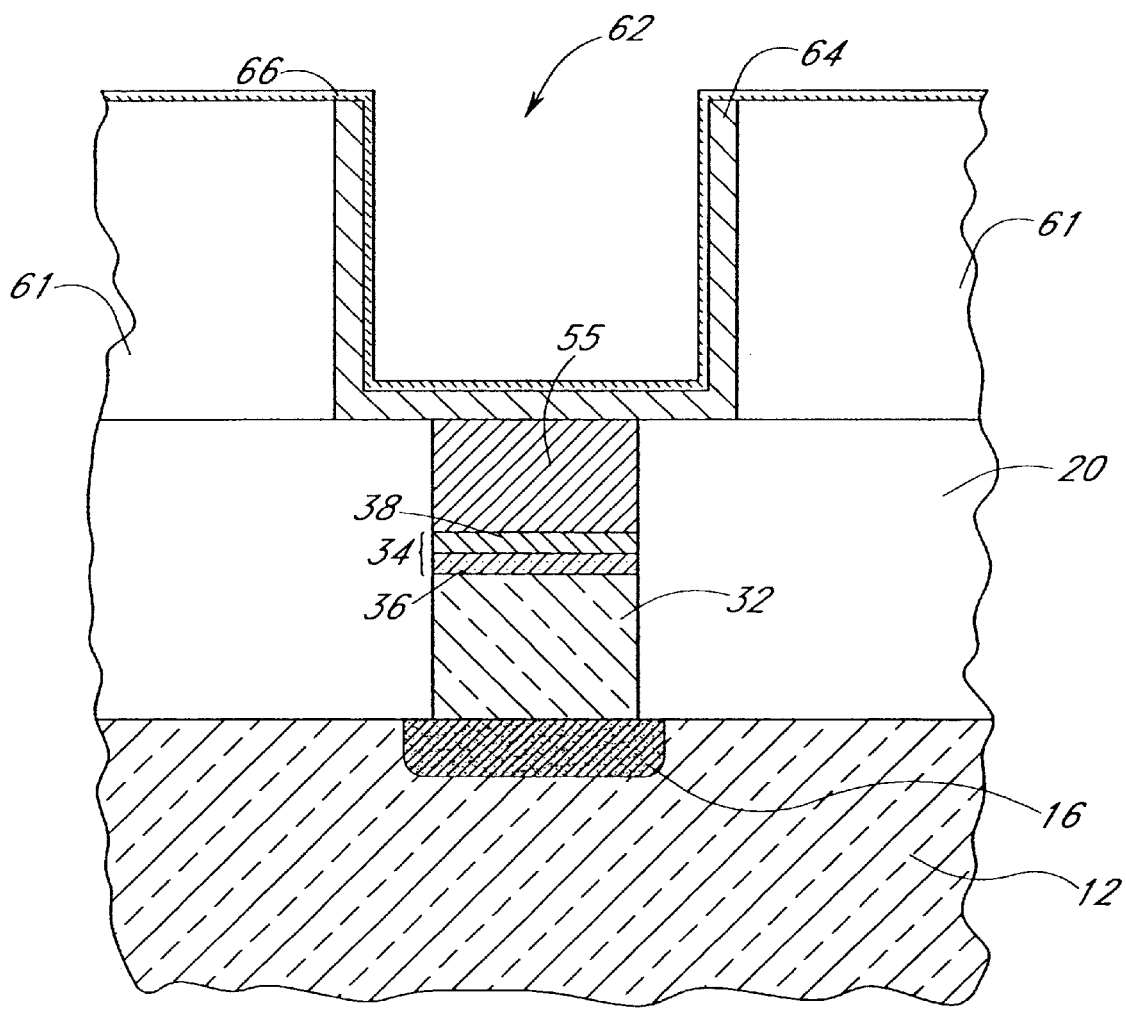
FIG. 10 schematically illustrates the integrated circuit of FIG. 9, where a high-k dielectric layer has been deposited over the bottom electrode.

A high k dielectric layer 66 is then deposited into the via, as illustrated in FIG. 10. The high k material preferably has a dielectric constant of about 10 or greater. Exemplary high k materials include $Ta_2O_5$, BST, ST, BT, PZT, etc. In the illustrated embodiment, the high k dielectric 66 comprises $Ta_2O_5$, deposited by MOCVD.

A common feature of such high k materials is the tendency to cause oxidation of surrounding materials, such as underlying plugs. Any suitable process, including but not limited to CVD, PVD or spin-on processes can deposit the high k dielectric layer 66. The preferred embodiments are particularly advantageous in preventing oxidation of underlying elements during high temperature, oxygen-rich curing anneals for filling oxygen vacancies in the high k material 66. The thickness of this high-k dielectric layer 66 is preferably between about 15 Å and 250 Å.

Figure 11:
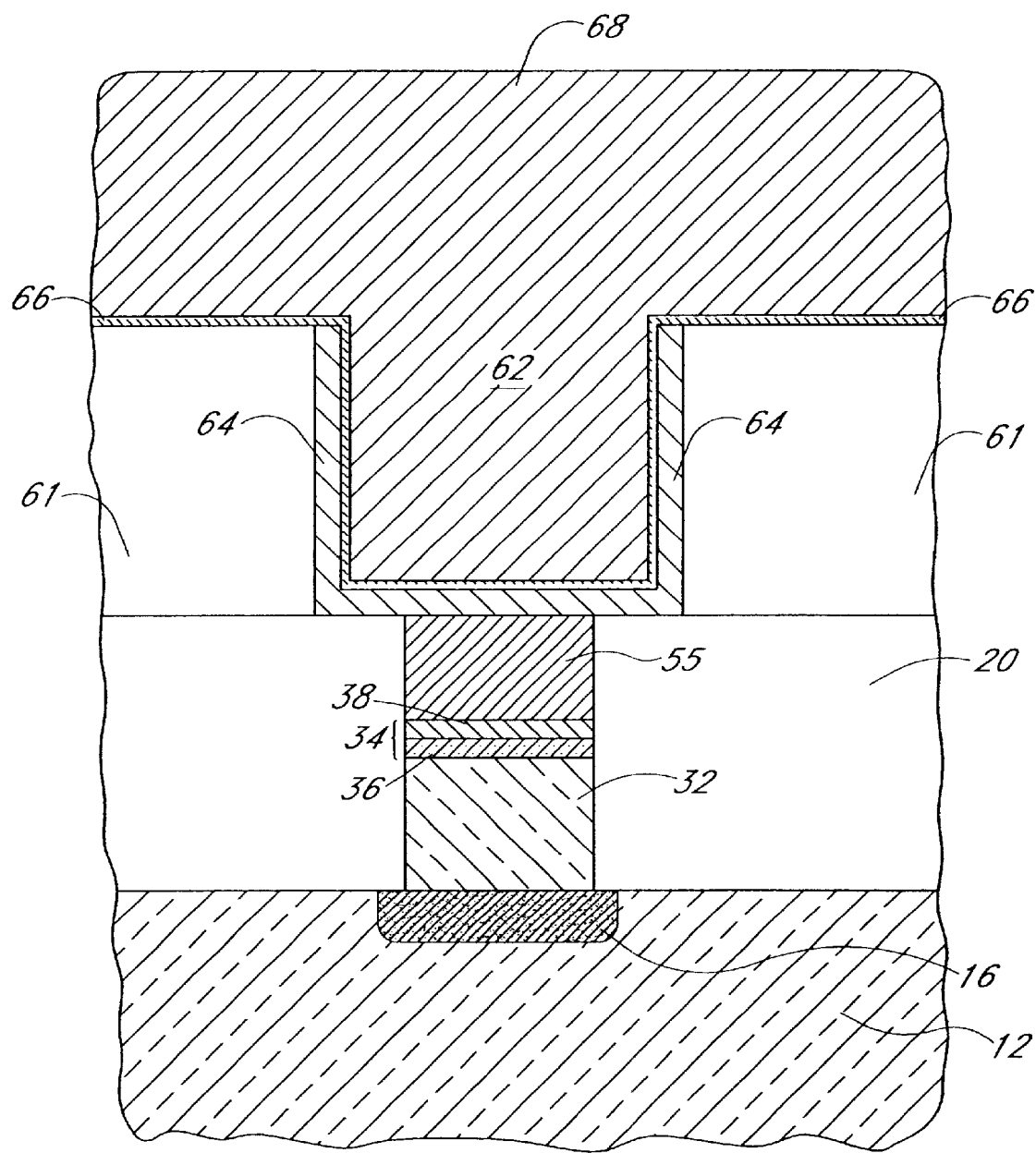
FIG. 11 schematically illustrates the integrated circuit of FIG. 10, where a top electrode layer has been deposited over the high-k dielectric layer.

The top electrode 68 of the capacitor 60 is then formed on top of the high k dielectric layer 66, as illustrated in FIG. 11. The top electrode consists of a conductive material, typically a metal deposited using one of a variety of standard processes known to persons skilled in the relevant art. The top electrode 68 can extend over all capacitors in an array, as shown, or it can be patterned to leave isolated capacitors.

Figure 12:
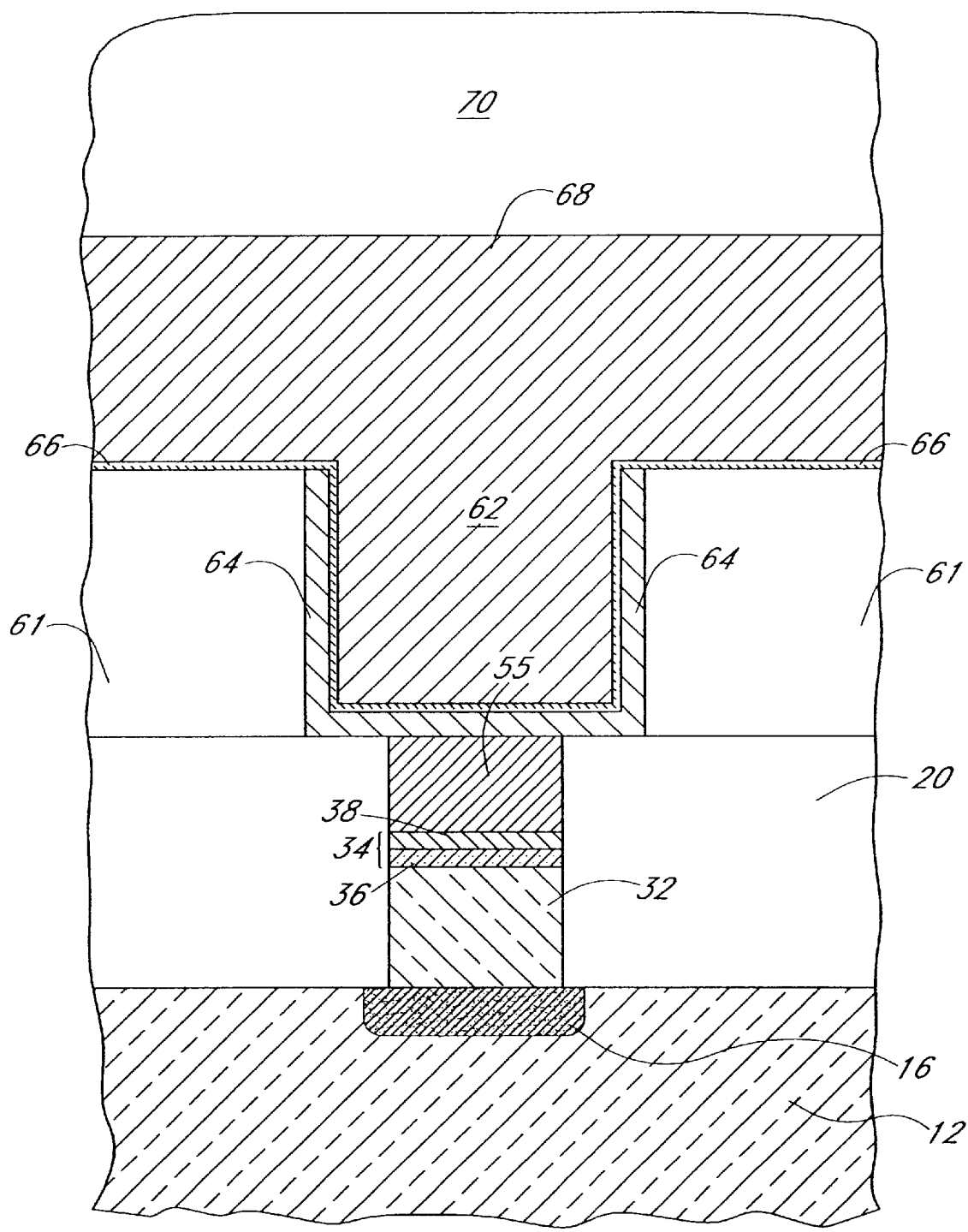
FIG. 12 schematically illustrates the structure of FIG. 11 following deposition of a third insulating layer, isolating the memory cells across the array from metal wires to be formed.

FIG. 12 shows another insulating layer 70 formed over the completed capacitor 60. As will be appreciated by the skilled artisan, the integrated circuit can then be completed by a series of metallization or wiring steps, followed by passivation of the chip.

The resultant memory cell structure comprises a MOSFET drain region 16, a capacitor 60, and a via 30 through a first insulating layer 20. The via 30 is filled with a conductive plug 80, which electrically connects the drain region 16 to the capacitor 60.

The conductive plug 80 comprises a partial polysilicon plug 32, a transition region 34 and a plug cap 55. The partial plug 32 comprises a conductive material is compatible and makes ohmic contact with the underlying substrate 12. The transition region 34 over the partial plug 32 comprises a conductive material which, in the preferred embodiment illustrated in FIG. 12, comprises a titanium silicide layer 36 directly over the partial plug 32, and a titanium nitride layer 38 over the titanium silicide layer 36. The transition region 34 extends generally horizontally across the plug 80, and intervenes between the underlying polysilicon partial plug 32 and overlying cap material 55.

The plug cap 55 overlies the first conductive barrier region 34 and within the via 60, preferably filling the remainder of the via 30 over the partial plug 32 and over the transition region 34. The unitary insulating layer 20 thus surrounds both the partial plug 32 and the aligned plug cap 55. Preferably, the cap 55 comprises a material that is conductive and resistant to oxidation. In the illustrated embodiment, the cap 55 comprises a noble metal, preferably platinum. The illustrated barrier plug cap 55 further comprises a second material that, combined with the selectively formed metal, forms an effective barrier to oxygen diffusion. In other arrangements, the barrier material can be formed during the selective process.

Advantageously, the material of the plug cap 55 has not been planarized or otherwise etched during the process of fabrication. Rather, the sacrificial layer was etched earlier in the process (namely by CMP), and that etch step defines the configuration of the final material that is substituted for the sacrificial layer. Alternatively, selective deposition enables formation of the plug cap 55 within the via 30, without the need for etching.

Although described above in connection with particular embodiments of the present invention, it should be understood the descriptions of the embodiments are illustrative of the invention and are not intended to be limiting. Various modifications and applications may occur to those skilled in the art without departing from the true spirit and scope of the invention as defined in the appended claims.

We claim:

1. A method of selectively forming a cap layer for a conductive plug of an integrated circuit, comprising:
   forming a via in an insulating layer, the via exposing a semiconductor substrate;
   forming a partial plug partially filling the via and directly contacting the substrate;
   depositing a sacrificial layer into the via, over the partial plug and over the insulating layer, the sacrificial layer in electrical contact with the partial plug;
   removing an excess portion of the sacrificial layer from over the insulating layer; and
   replacing atoms of the sacrificial layer within the via with atoms of a cap material.

2. The method described in claim 1, wherein removing comprises planarizing.

3. The method described in claim 2, wherein planarizing comprises a chemical mechanical polish.

4. The method described in claim 1, wherein the sacrificial layer is formed of a material that is readily oxidized and removed by chemical mechanical planarization.

5. The method described in claim 1, wherein the sacrificial layer is selected from the group consisting of copper, aluminum, tungsten and titanium.

6. The method described in claim 1, wherein the cap material is resistant to oxidation.

7. The method described in claim 1, wherein the cap material comprises a material selected from the group consisting of gold, platinum, palladium, silver, iridium, ruthenium, rhodium and osmium.

8. The method described in claim 1, wherein replacing comprising conducting an immersion plating process.

9. The method described in claim 1, further comprising forming a transition region over the partial plug and under the sacrificial layer.

10. The method described in claim 9, wherein the transition region comprises a conductive diffusion barrier layer.

11. The method described in claim 10, wherein the conductive diffusion barrier layer comprises a metal nitride.

12. The method described in claim 9, wherein forming the transition region comprises blanket depositing a refractory metal over the partial plug and annealing the refractory metal.

13. The method described in claim 9, wherein the transition region comprises a metal silicide.

14. The method described in claim 1, wherein the partial plug comprises conductively doped polycrystalline silicon.

15. The method described in claim 1, wherein forming the partial plug comprises blanket depositing a layer within the via and recessing the layer within the via.

16. The method described in claim 15, wherein recessing comprises a reactive ion etch.

17. The method described in claim 15, wherein recessing comprises a wet chemical etch.

18. The method described in claim 1, wherein the method further comprises converting the plug cap into a diffusion barrier.

19. The method described in claim 18, wherein converting comprises depositing a material selected from the group consisting of iridium, rhodium and ruthenium over the plug cap and alloying the material with the plug cap.

20. A method of fabricating a system including an integrated circuit, comprising:
   filling a contact via in an integrated circuit with a silicon plug;
   recessing the silicon plug within the via;
   forming a plug cap comprising a noble metal selectively over the recessed silicon plug without etching the noble metal; and
   forming a capacitor over the plug cap, the capacitor incorporating a material with a dielectric constant greater than about 10.

21. The method described in claim 20, wherein the silicon plug contacts a semiconductor substrate.

22. The method described in claim 20, wherein the plug cap comprises platinum.

23. The method described in claim 22, further comprising forming a barrier material from the plug cap.

24. The method described in claim 20, wherein forming the plug cap comprises electroless plating the noble metal over the recessed plug.

25. A method of fabricating a system including an integrated circuit, comprising:
   filling a contact via in an integrated circuit with a silicon plug;
   recessing the silicon plug within the via;
   forming a plug cap comprising a noble metal selectively over the recessed silicon plug without etching the noble metal;

forming a capacitor over the plug cap, the capacitor incorporating a material with a dielectric constant greater than about 10; and forming a barrier layer over the recessed silicon plug prior to forming the plug cap.

26. The method described in claim 25, wherein the barrier layer comprises a metal nitride.

27. A method of fabricating a system including an integrated circuit, comprising:

filling a contact via in an integrated circuit with a silicon plug;

recessing the silicon plug within the via;

forming a plug cap comprising a noble metal selectively over the recessed silicon plug without etching the noble metal, wherein the plug cap comprises platinum;

forming a barrier material from the plug cap, wherein forming the barrier material comprises alloying the plug cap with a second metal; and forming a capacitor over the plug cap, the capacitor incorporating a material with a dielectric constant greater than about 10.

28. A method of fabricating a system including an integrated circuit, comprising:

filling a contact via in an integrated circuit with a silicon plug;

recessing the silicon plug within the via;

forming a plug cap comprising a noble metal selectively over the recessed silicon plug without etching the noble metal, wherein the plug cap comprises platinum;

forming a barrier material from the plug cap, wherein forming the barrier material comprises converting an upper surface of the plug cap to a metal alloy; and forming a capacitor over the plug cap, the capacitor incorporating a material with a dielectric constant greater than about 10.

29. A method of fabricating a system including an integrated circuit, comprising:

filling a contact via in an integrated circuit with a silicon plug;

recessing the silicon plug within the via;

forming a plug cap comprising a noble metal selectively over the recessed silicon plug without etching the noble metal, wherein forming the plug cap comprises depositing a sacrificial metal having a lower potential than the noble metal over the recessed silicon plug, chemical mechanical planarizing the sacrificial metal, and replacing the sacrificial metal with the noble metal; and forming a capacitor over the plug cap, the capacitor incorporating a material with a dielectric constant greater than about 10.

30. A process for forming an integrated circuit memory cell, comprising:

forming a recessed plug within a via through an insulating layer, the recessed plug electrically connected to a transistor active area;

selectively forming a cap layer within the via over the recessed plug, the cap layer comprising a non-oxidizing conductive material, wherein selectively forming comprises:

blanket depositing a sacrificial layer over the recessed plug;

polishing the sacrificial layer to leave the sacrificial layer only within the via; and selectively replacing the polished sacrificial layer with the cap layer; and forming a capacitor over the cap layer, the capacitor incorporating a dielectric material characterized by a dielectric constant greater than about 10.

31. The process of claim 30, wherein selectively replacing comprises immersion plating.

32. A method of forming a plurality of non-oxidizing contact structures in an integrated circuit, the method comprising:

forming a plurality of openings through an insulating layer;

blanket depositing a sacrificial material over the insulating layer and into the openings;

removing the sacrificial layer from over the insulating layer outside the openings; and replacing the sacrificial layer inside the openings with a non-oxidizing material, wherein replacing comprises immersion plating.

33. The method of claim 32, wherein the non-oxidizing material comprises a metal having a higher reduction potential the sacrificial layer.

34. The method of claim 33, wherein the metal comprises platinum.

35. The method of claim 32, wherein the non-oxidizing material comprises a oxygen barrier.

36. The method of claim 32, wherein the non-oxidizing material has characteristics making it difficult to planarize.

37. The method of claim 32, wherein the non-oxidizing material comprises a conductive oxide.

38. A method of forming a plurality of non-oxidizing contact structures in an integrated circuit, the method comprising:

forming a plurality of openings through an insulating layer;

blanket depositing a sacrificial material over the insulating layer and into the openings;

removing the sacrificial layer from over the insulating layer outside the openings, wherein removing comprises polishing; and replacing the sacrificial layer inside the openings with a non-oxidizing material, wherein replacing comprises immersion plating.

39. A method of forming a plurality of non-oxidizing contact structures in an integrated circuit, the method comprising:

forming a plurality of openings through an insulating layer;

blanket depositing a sacrificial material over the insulating layer and into the openings;

removing the sacrificial layer from over the insulating layer outside the openings; and replacing the sacrificial layer inside the openings with a non-oxidizing material, wherein the openings are partially filled with silicon prior to blanket depositing.

40. A method of forming a plurality of non-oxidizing contact structures in an integrated circuit, the method comprising:

forming a plurality of openings through an insulating layer;

blanket depositing a sacrificial material over the insulating layer and into the openings;

removing the sacrificial layer from over the insulating layer outside the openings; and replacing the sacrificial layer inside the openings with a non-oxidizing material, wherein the non-oxidizing material comprises a conductive oxide.

* * * * *